United States Patent [19]
Vested

[11] 4,023,971
[45] May 17, 1977

[54] FILM AND METHOD FOR FORMING INTAGLIO PRINTING PLATES

[76] Inventor: Harry S. Vested, P.O. Box 13, Mount Morris, Ill. 61054

[22] Filed: Apr. 26, 1976

[21] Appl. No.: 679,894

Related U.S. Application Data

[63] Continuation of Ser. No. 525,837, Nov. 21, 1974, abandoned, and a continuation-in-part of Ser. No. 339,862, March 9, 1973, abandoned.

[52] U.S. Cl. .................................. 96/36.3; 96/35; 96/38; 101/150; 101/401.1; 101/128.4; 156/659; 156/630; 204/129.65

[51] Int. Cl.² .................... G03F 7/02; B41C 1/02

[58] Field of Search ............... 96/36, 36.3, 32, 35; 96/38; 156/8, 14, 16; 204/129.65; 101/150, 170, 395, 401.1, 128.4

[56] References Cited

UNITED STATES PATENTS

| | | | |
|---|---|---|---|
| 1,064,166 | 6/1913 | Pindikowsky | 101/128.4 |
| 2,182,559 | 12/1939 | Henderson | 96/38 |
| 2,940,868 | 6/1960 | Patchell | 101/153 |
| 3,210,186 | 10/1965 | Gorig | 101/401.1 |
| 3,455,239 | 7/1969 | Smith | 96/36.3 |

Primary Examiner—Clyde I. Coughenour
Attorney, Agent, or Firm—Leydig, Voit, Osann, Mayer & Holt, Ltd.

[57] ABSTRACT

A method of making a printing plate for intaglio printing having text characters and/or other indicia recessed therein for receiving printing ink which has a plurality of relatively thin barriers separating the text characters into a plurality of ink wells and defining surfaces for supporting a doctor blade during printing, the support surfaces intersecting the edges of each of the text characters at generally right angles and intersecting other supports at generally right angles to improve the quality of the printing of the text characters by minimizing the non-printing areas within the edges of the text characters and effectively retaining the shape of the edges of the characters, and a film or other photographic product for use in making such plates. The doctor blade supports are also designed to compensate for uneven material removal by chemical etching or the like so that the thickness of the supports are more uniform to minimize the non-printed areas within the edges of the characters.

6 Claims, 7 Drawing Figures

FILM AND METHOD FOR FORMING INTAGLIO PRINTING PLATES

RELATED APPLICATIONS

This is a continuation of application Ser. No. 525,837 filed Nov. 21, 1974, now abandoned, and a continuation-in-part of application Ser. No. 339,862 filed Mar. 9, 1973, now abandoned.

This invention relates generally to intaglio printing and, more specifically, to gravure, and particularly photogravure, printing.

Broadly stated, intaglio printing which includes gravure is performed by applying a printing plate to a cylindrically shaped drum wherein text characters or other indicia to be printed on paper or other material are etched by chemical, mechanical or other means such as radiation in the surface producing recesses for receiving ink therein that is transferred to the material being printed. As ink is applied to the recessed etched areas, a very thin blade, commonly referred to as a doctor blade, is scraped over the surface to remove excess ink, leaving ink only within the recessed areas so that the general surface of the plate is free of ink. The doctor blade is held against the surface with varying degress of pressure and is sufficiently flexible so that it may extend slightly within the etched areas during operation, depending upon the amount of pressure or force that is being applied to the blade. Even though the individual characters or other symbols or the like can be quite small, the flexibility of the doctor blade requires the introduction of doctor blade supports within the individual characters themselves to enable the doctor blade to ride across the interior of the characters during the printing operation to permit retention of the ink in the wells and to prevent the edges of the characters from wearing excessively and the doctor blade from damage.

The intaglio printing process of gravure and rotogravure has been generally considered as the superior reproduction process for tonal work since its inception. This is a practical means of presenting a truly three-dimensional quantity of fluid ink to a surface for an extremely wide tonal range. Although the heaviest printing areas are not a complete ink carrying surface in the gravure process due to the necessity of the doctor blade supports, the quantity and fluidity of the ink create a covering of those non-printing surfaces due to the flow of the ink. This characteristic achieves heightened effects in tonal reproduction and is required, in part, for type and line reproduction. All line printing, including the specialized characteristics of text type, should be reproduced as a solidly printed, sharp-edged area.

Typically, methods for forming intaglio plates were based upon the available typesetting methods. Thus, hot metal cast into type characters was unable practically to include doctor blade supports, particularly in the first step of reproduction. Hence, such supports have been inserted onto light sensitive material by means of a separate crossline or similar screen exposure to light. The type was also superimposed onto the same light sensitive material by light exposure.

It is thus conventional practice in the making of an intaglio printing plate to introduce doctor blade supports by providing a finely crosslined screen or grid pattern which may vary within the general range of about 120 up to 300 lines per inch. The plate is presently typically made by printing the crosslined screen or grid in negative form (i.e. — transparent lines and opaque spaces) on a layer of etching resist, followed by printing a positive (i.e. — transparent background and opaque symbols) of the text characters or other indicia onto the same layer and thereafter applying the resist layer to a cylinder. The text characters, for example, will have only interior portions between grid lines unexposed to light, and the remaining portion of the surface will have been exposed to light and thus will be light hardened. The light hardened areas are resistant to the passage of etching chemicals so that when the chemicals are applied, the only areas which will be etched away will be those areas between the grid lines on the inside of the edges of the individual text characters. After etching, the resist is thereafter removed, resulting in the intaglio cylinder, the surface of which is smooth except for the etched or recessed areas which will receive ink during printing for transfer to the material being printed.

Presently, it is common practice for intaglio technicians, through trial and error, to select and use various crosslined screens or grids to achieve the best general appearance for a block of type and probably for an entire work of printing by selecting the size of the screen grids (i.e., the number of crosslines per inch) and angularly orienting the grid to achieve optimum quality for the work being printed. It should be apparent that the individual grid lines will be randomly placed within the individual text characters or symbols or the like; and the quality of the printing will suffer if, for such individual characters, edges, serifs and other portions of individual characters are cut off or interrupted at undesirable locations.

In some cases, gains in improved reproduction are obtained by appropriate selection of the screen size as well as rotation; but text type often also includes roman or itallic type as well as capitals, small caps, multiple sizes and even faces. In such situations, improved reproduction in one area is offset by lessened reproduction in other areas. To attempt to lessen the reproduction problems, there have also been attempts to etch the wells to depths greater than would otherwise be necessary in an effort to make up in the third dimension of depth for the ink quantity lost in the two-dimensional areas through the clear lines blockout of a substantial percentage of the type character and its special characteristics. The resultant printing is often of less than desired quality due to the relatively large non-printing areas along the edges plus the excessive and indiscriminate migration of the ink from such overly deep wells.

As shown in the prior art representation of FIG. 1 illustrating an enlarged W with a grid pattern defining the doctor blade supports, certain of the corners of the characters, such as at 10 and 12, and the edges of the W are cut off or significantly altered where the angle of the grid is slightly different from the angle of the "stroke" of the letter, as at 14 and 16. The quality of the printed W will be less than optimum, for the reason that the grid lines themselves are essentially non-printing areas since ink is not present in those areas, and the resulting printed character often has jagged edges, cut off serifs and corners which can easily be seen under magnification and which are often apparent to the naked eye.

Accordingly, it is an object of the present invention to improve the quality of the intaglio printed work by providing a method of making an intaglio printing plate wherein the doctor blade supports are strategically positioned within the text characters or other indicia.

Another object of the present invention provides a method of making an intaglio printing plate which minimizes the non-printing areas and thereby improves the quality of the printed matter by providing an intaglio printing plate having text characters or other indicia wherein the doctor blade supports are themselves strategically shaped, as well as positioned.

Yet another object of the present invention lies in the provision of a method of making an intaglio plate which reduces the quantity of ink required during printing by minimizing the non-printing areas within the text characters thereby requiring lesser amounts of ink to extend over the surface of the non-printing areas.

Another related object of the present invention is to provide a method of making an intaglio printing plate that may be produced by a one step photogravure process rather than a two step text character and screen grid process which heightens light diffusion and often reduces the quality of the printing plate itself through coupling the character and its doctor blade supports into the type and other indicia generation. A closely related object of the present invention is to provide a method of making an intaglio printing plate from an intaglio etching guide for controlling mechanical, chemical or other means such as radiation that may be produced from the film prepared with segmented text characters thereon.

Still another object of the present invention provides a method of making an intaglio printing plate which substantially eliminates the printing of non-uniform edges and the attendant cutting off of portions of individual text characters in an intaglio printing by providing an intaglio plate wherein the doctor blade supports within the characters are sized and positioned in a manner that is equivalent to conventional sized screen grids, but the size, shape and position of the supports more effectively maintain the continuity of the edges of the individual characters. A related object lies in such a method wherein the areas of the individual ink wells defined by the edges of the characters and the individual supports are maximized, thereby minimizing the depth of the wells.

A more specific object provides a method of making an intaglio printing plate which compensates for the unevenness of material removal by chemical etching or the like in those corners or other areas of a text character where flow of liquid chemicals or removal by other means may be restricted by systematically shaping the individual type edges and doctor blade supports for the intaglio printing plate.

Still another specific object of the invention provides a method for making an intaglio printing plate that minimizes interference with the edges of the characters and prevents the presence of acute angles between supports and character edges, thereby minimizing the presence of restricted removal areas which would result in larger non-printing areas than are desired, by providing for the doctor blade supports within the text characters of an intaglio printing plate to merge or join other supports as well as the edges of the text characters at generally right angels.

Yet another object of this invention is to provide a film or other photographic product having text characters or other indicia thereon which may be utilized in making an intaglio printing plate having the hereinbefore described characteristics.

Other objects and advantages will become apparent upon reading the following detailed description while referring to the attached drawings, in which.

Figure 1:
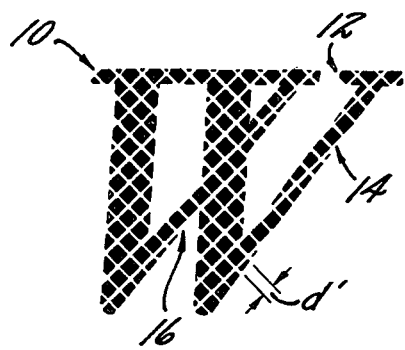
FIG. 1 is an enlarged prior art representation of a text character W, showing the presence of crosslined doctor blade supports in an intaglio printing plate and particularly illustrating the undesirable interference with the character edges as previously described.

While the present invention will be described in connection with certain preferred embodiments, it should be understood that it is not intended to be limited to those embodiments. On the contrary, it is intended that the invention include all alternatives, modifications and equivalents as may be included within the spirit and scope of the invention as expressed in the appended claims.

In general, the present invention provides a method for making an intaglio printing plate which comprises making a special film having text characters thereon, providing a plate having a photoresist, exposing the photoresist to impress the text characters thereon and removing the unexposed portions to form a printing plate having a plurality of wells grouped together with the edges of each group defining a text character and with doctor blade supports in the wells. The special film includes text characters which are segmented, and such segmented text characters provide the intaglio printing plate with text characters wherein the doctor blade supports intersect other of said supports generally perpendicularly to a line tangent to said other supports at the point of intersection, the doctor blade supports intersecting the edges generally perpendicular to a line tangent to the edges at the point of intersection so that adjacent supports within the interior of the text characters fail to merge at less than about 90°.

Turning now to the drawings and particularly FIGS. 4–7, several text characters are illustrated which incorporate the present invention. With the advent of phototypesetting in the recent past, it is possible to rapidly photographically reproduce text characters using photographically or computer memory stored text characters. If each symbol or text character is combined and provided with a pattern of doctor blade supports incorporating the aspects of the present invention, the quality of the resulting printed material can be greatly enhanced over the present practice of incorporating, or inserting, a crosslined screen or grid pattern as shown in the prior art representation of FIG. 1. Thus, with the phototypesetting techniques that are presently available, it is possible to provide integral doctor blade supports within each character or other indicia to optimize the quality of the printed matter.

The printing technique of photogravure is reaching an ever expanding market even though its primary disadvantage is in its comparative lack of quality in the printed text matter when using about 120 to 300 lines per inch grid patterns. However, gravure has an advantage in that the printing plates have great longevity and are accordingly well suited for extremely long runs of printing. Because the crosslined doctor blade supports predominantly used often result in a optically broken effect on smaller sized type and other characters that have serifs and other fine line work, this relative lack of quality can be a major factor militating against its use. By examining gravure printed material under magnification, it is often noted that the edges of the individual characters are jagged and thin line work is discontinuous with corners cut off and the like. In many instances, the effect of such lack of continuity is visible to the naked eye; and, even if the individual imperfections are not consciously observed, one often has the subjective feeling that quality is lacking.

Figure 4:
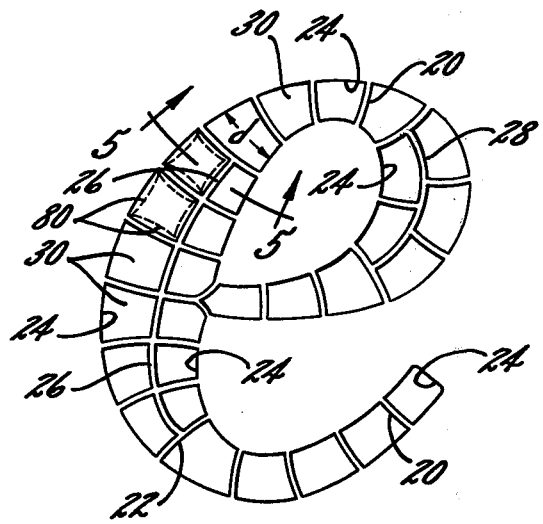
FIGS. 4, 6 and 7 are enlarged plan views of the text characters for an intaglio printing plate wherein the doctor blade supports are shaped and positioned within the characters in accordance with the present invention and, FIG. 5 is an idealized cross section taken generally along the line 5—5 of FIG. 4.
Figure 5:
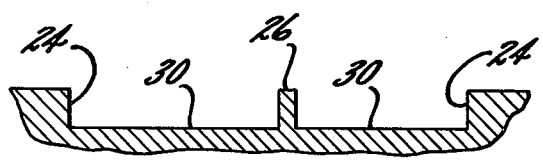

In keeping with the present invention, and referring specifically to FIGS. 4 and 5, which illustrate a character $e$ that has been enlarged for the sake of clarity, it is seen that the interior of the letter includes a number of doctor blade supports such as at 20 and 22, for example, which extend between the edges 24. Where the thickness of the character requires it, intermediate supports, such as at 26 and 28, may be required to further isolate the recessed areas into individual ink wells 30 as shown.

Figure 2:
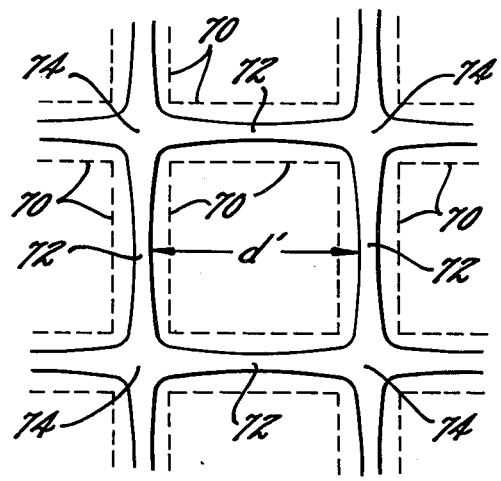
FIG. 2 is a greatly enlarged illustration of prior art crosslined doctor blade supports with the portion in phantom illustrating the outline of the light hardened crosslined grid on etching resist, the portion shown in solid lines representing in somewhat idealized form the resulting doctor blade supports that are produced after chemical etching and emphasizing the uneven thickness thereof.

While the size of individual wells 30 may vary somewhat throughout the character, an equivalency in terms of the crosslined grid pattern such as that shown in FIG. 1 may be achieved by limiting the maximum distance $d$ along an individual support between junctions for example, to be no greater than the distance $d'$ between opposed surfaces shown in FIGS. 1 and 2. By so doing, supports may be provided in the character shown in FIG. 4 embodying the present invention that would be equivalent in size or spacing of the supports to the crosslined pattern shown in the prior art illustration of FIG. 1. Once the distance $d$ reaches the maximum value in terms of the desired equivalents whether it be in comparison to a 150 or other line screen, it is only necessary to introduce other supports and form additional ink wells. As is particularly seen in FIG. 6, where a C is illustrated, at the leftward portion of the text character where the thickness reaches its largest dimension, the illustrated ink wells 32, 34 having doctor blade supports 36 and 38 with a noted distance $d$ along their respective upper sides may be equivalent to the distance $d'$ between adjacent grid lines shown in FIGS. 1 and 2. Thus, as the thickness increases in the illustrated text character C, it is then necessary to have a pair of supports 42 and 44 which define a total of three ink wells 46, 48 and 50 across the thickness of the character in the vertical portion thereof.

To calculate the maximum distance $d$ in terms of an equivalent size grid pattern, and in the event a 150 line per inch grid pattern is used as as guide, the doctor blade supports or individual grid lines could suitably be about 6 ten thousandths of an inch thick with the distance $d'$ between adjacent grid lines being approximately 6 one thousandths. Thus, in terms of an equivalency, the distance $d$ for the characters illustrated in FIGS. 4, 6 and 7 would be no greater than approximately 6 one thousandths. With such an equivalency, it is presently preferred that the depth of the individual ink wells be within the range of approximately 10 to 15 ten thousandths of an inch. However, depths of ink wells within the range of 6 to 8 ten thousands of an inch may be feasible utilizing the present invention.

In accordance with an important aspect of the present invention, to minimize the non-printing areas within the character and, more specifically, to maintain the desired shaping edges 24 intact, the doctor blade supports which merge with the edges 24 are preferably generally perpendicular to the edges of the point of intersection, certain exceptions being explained in detail hereinafter. More accurately stated, the supports 20 are generally perpendicular to a line that is tangent to the edge 24 where the support joins that edge. Generally perpendicular as defined herein is meant to be within the range of about 80° to 100° since it is unnecessary that it be exactly 90°. The intent is to provide open (i.e. — about 90° or more) and generally equal angles between intersecting edges and supports for balanced areas in those corners and to prevent the presence of substantial acute angles between intersecting edges and supports which generates restricted areas in the corners and also increases the width of the support at the point of merge with the shaping edges of the character. For example, if a support surface is, for example 6 ten thousandths of an inch wide and merges with the edge of a character at a right angle it will interrupt the continuity of the edge for only a distance of 6 ten thousands. However, if it merges at an angle of 45°, the interruption will be a distance of about 8.5 ten thousands or 40% greater. Thus, the generally perpendicular intersection is quite different from the prior art representation of FIG. 1 where the grid lines merge with the outer edges of the character at rather small acute angles in some locations which has the tendency of destroying the continuity of the edge and accordingly detracts from the quality of the resulting printed matter.

It should be understood that the doctor blade wipes or removes ink from the non-recessed portions of the printing plate and that no ink will be present on the upper surface of each of the supports. Therefore, to provide for continuity of ink throughout the complete interior of the printed character, it is necessary for the ink to wash over or migrate into those areas where the supports are located. It should be realized that if the non-printing areas within the edges of the characters are no larger than is necessary for proper support of the doctor blade during operation, that lesser amounts of ink for such migration or overlap would be required. To this end, provision for having the doctor blade supports intersect the character edges generally perpendicularly relative thereto, or even more open, as has been described herein, will have a tendency to minimize the alteration or otherwise destruction of the integrity of the shaping edges 24 of the individual characters.

Figure 6:
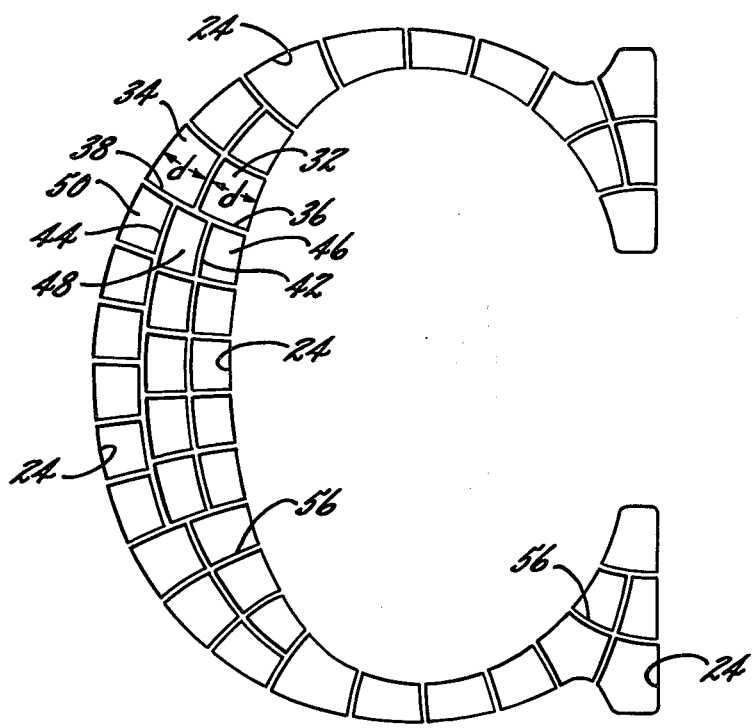
Figure 7:
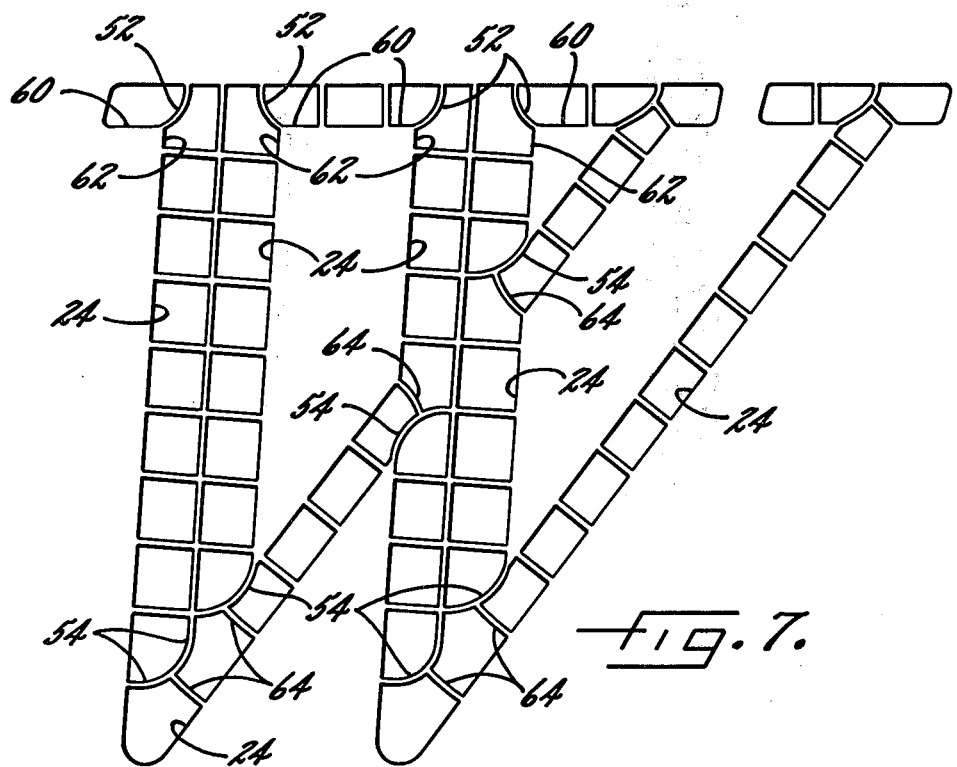

To achieve the generally perpendicular intersection of individual supports with the outer edges of the character and referring to FIGS. 6 and 7, it may be necessary to provide curved supports as indicated at 52, 54 and 56 for example, but it is usually sufficient for the supports to be substantially straight. With respect to the supports 52 shown in FIG. 7 and particularly the lower end thereof which intersect the corners of the character, the lower end intersects at balanced angles of approximately 135° relative to either the generally horizontal edges 60 or the generally vertical edges 62. By shaping the support surfaces as shown at 52, it is possible to create open angles of about 90° or more between intersecting edges and supports and to thus eliminate acute angles of the supports relative to an edge, which is quite desirable as will hereinafter be more fully explained.

In accordance with another aspect of the present invention, the supports intersect other supports generally perpendicularly and, referring to FIG. 7, this is shown with the merging of supports 64 into supports 54 at generally right angles. This presents open and balanced angles and also substantially eliminates the presence of acute angles between two adjoining supports within the interior of the characters.

In keeping with yet another important aspect of the present invention and referring to a prior art representation of FIG. 2, the crosslined grid support pattern that is light hardened in the etching resist during production of a printing plate is shown by phantom lines 70 with the square areas between said lines being unexposed to light and therefore subject to being etched when the plate is subjected to the chemical etching liquid. The result after completion of etching and after removal of the etching resist is a crosslined grid pattern, the individual supports 72 of which are of varying thickness. Generally, midway between the junctures or intersections 74, the supports 72 are of minimum thickness and they gradually increase as they approach the junctures 74. This is due, at least in part, to the uneven chemical removal of the plate material. It is generally recognized that in those restricted areas such as corners and particularly where the angles are significantly less than 90°, the flow of the chemical liquid will be restricted and accordingly uneven chemical etching results. Thus, where two grid lines 72 intersect one another a lesser amount of material is removed thereby tending to maximize the non-printing area.

Figure 3:
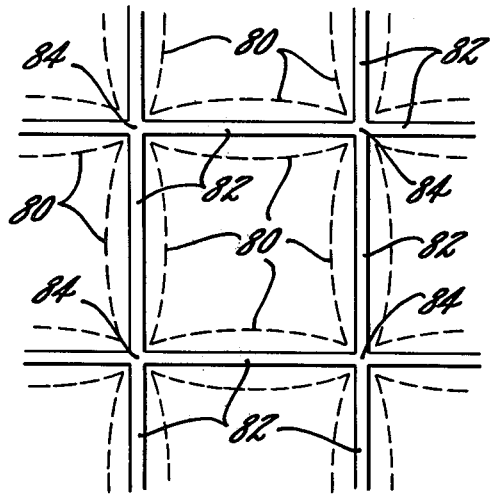
FIG. 3 is a plan view of an enlarged crosslined screen or grid pattern embodying a feature of the present invention wherein the phantom representation illustrates the light hardened grid produced on etching resist before etching is performed, the solid lines representing the resulting doctor blade supports which are of uniform thickness in comparison with the prior art illustration of FIG. 2.

To compensate for this inherent unevenness in chemical etching of the material of the printing plate, and referring to FIG. 3, the light hardened areas of a typical grid of crosslined screen pattern shown in phanton by lines 80 are curved in a manner to compensate for the restricted flow of liquid chemicals during etching. Thus, in the representation shown in FIG. 3, embodying the present invention, the outline of the light hardened supports defined by the phantom lines 80 are curved so that the thickness or width is increased midway between junctions 84. The lines are also extended inwardly toward the center of each junction by a greater amount than the prior art representation of FIG. 2 to compensate for the relatively reduced activity by the etching chemical in those restricted flow areas. The net effect is that the resulting doctor blade supports 82 are generally of uniform thickness throughout, and the non-printing areas at the junctures or intersections 84 are not enlarged as is the case for the representation shown in FIG. 2. While the representation shown in FIG. 3 is shown in conjunction with a crosslined grid pattern for the purposes of illustration, the phantom lines 80 are also representatively included in the FIG. 4 text character and such compensating curvature may be utilized for all supports and edges shown in FIGS. 4, 6 and 7. The amount of compensating curvature required for the supports may be varied to result in relatively poor shape for edges and uniform width for the supports after etching. The idealized representation shown in FIG. 3 is broadly accurate and functional.

The curvature of the supports 52 and 54 so that they join the outer edges of the text characters at generally right angles and the intersection of curved supports 54 with supports 64 at generally right angles, tend to minimize the restricted flow areas in that angles between edges and supports or between supports which joined other supports are preferably never less than approximately 90° as has been herein described. Thus, the etching chemical will be able to flow in these areas without substantial restriction or, in other words, the amount of restricted flow areas are minimized to the greatest degree possible.

In addition to maintaining the structural continuity and integrity of the shaping edges of the individual characters by joining the supports with the edges of the characters as close to perpendicularity, and evenly balanced, as the shape of the character will permit in totality, corners, serifs and other fine line work will not be interrupted or cut off and the non-printing areas occupied by the supports will be minimized. Conversely, the minimization of the non-printing areas maximizes the areas of the ink wells surrounded by the supports and edges; and, accordingly, lesser amounts of ink will generally be required since less overstrike or migrating ink will be required to cover the non-printing areas during printing.

By combining integral supports with the text characters and/or other indicia, the light hardening of the characters including the supports may be performed with a single operation rather than separately light hardening the characters and the doctor blade support pattern and thus minimize the effect of light diffusion that often occurs during a two step operation. The same combination simplifies the preparation of an intaglio etching guide for mechanical or other means such as radiation and accordingly minimizes the effects of light diffusion with the attendant quality losses. The overall result is that superior printing is achieved without the attendant jagged edges and cut off corners, serifs and the like and without discontinuity of very fine line work.

By incorporating the various aspects of the present invention into photogravure, much of the commonly held opinions as to the possible quality of work printed by gravure will be greatly dispelled. Thus, it is believed that all of the foregoing objects and advantages have been fully satisfied.

I claim as my invention:

1. In a phototypesettng method of forming a printing plate for intaglio printing which comprises making a film having text characters thereon with at least portions of at least certain of said characters being rectilinear and at least portions of at least certain of said characters being curvilinear and non-rectilinear, said characters comprising a plurality of ink well areas separated by a plurality of doctor blade support areas within each character; exposing a gravure printing plate photoresist to light passed through said film; and then etching the unexposed and processed portions of the printing plate with a solution to form a plurality of ink wells defining said text characters and doctor blade supports, the improvement comprising:

making said film with the center lines of said doctor blade support areas intersecting each other and the edges of said text characters, including both the said rectilinear and the curvilinear and non-rectilinear character edges, at angles of about 90° to facilitate the flow of etching solution into and out of the corners of the well areas formed in the exposed and processed photoresist at said intersections, to minimize the distance between the resulting adjacent etched ink wells at said intersections, and to facilitate the flow of ink into and out of the corners of the resulting wells at said intersections.

2. A phototypesetting method as set forth in claim 1 wherein said doctor blade support areas increase in width between said intersections so that the etching of the resulting wells in the printing plate produces doctor blade supports of substantially uniform width throughout each text character.

3. A phototypesetting method as set forth in claim 1 wherein the center lines of at least selected portions of said doctor blade support areas are curved to form said angles of about 90° at said intersections.

4. In a film having text characters thereon for use in a phototypesetting method of forming a printing plate for intaglio printing, said characters on the film comprising a plurality of ink well areas separated by a plurality of doctor blade support areas within each character with at least portions of at least certain of said characters being rectilinear and at least portions of at least certain of said characters being curvilinear and non-rectilinear, the improvement comprising:

the center lines of said doctor blade support areas intersecting each other and the edges of said text characters, including both the said rectilinear and the curvilinear and non-rectilinear character edges, at angles of about 90° to facilitate the flow of etching solution into and out of the corners of the well areas formed in a gravure printing plate photoresist exposed to light passed through said film and then processed, to minimize the distance between adjacent ink wells formed by etching the unexposed and processed portions of the printing plate, and to facilitate the flow of ink into and out of the corners of the resulting wells at said intersections.

5. A phototypesetting method as set forth in claim 4 wherein said doctor blade support areas increase in width between said intersections so that the etching of the resulting wells in the printing plate produces doctor blade supports of substantially uniform width throughout each text character.

6. A phototypesetting method as set forth in claim 4 wherein the center lines of at least selected portions of said doctor blade support areas are curved to form said angles of about 90° at said intersections.

* * * * *